(12) United States Patent
Ho et al.

(10) Patent No.: US 10,560,134 B2
(45) Date of Patent: Feb. 11, 2020

(54) MULTIBAND AGGREGATION RECEIVER ARCHITECTURE

(71) Applicants: Tan Huy Ho, Stittsville (CA); Xinyu Xu, Kanata (CA); David Neal Wessel, Kanata (CA)

(72) Inventors: Tan Huy Ho, Stittsville (CA); Xinyu Xu, Kanata (CA); David Neal Wessel, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/888,612

(22) Filed: Feb. 5, 2018

(65) Prior Publication Data

US 2019/0245570 A1 Aug. 8, 2019

(51) Int. Cl.
| | | |
|---|---|---|
| *H03K 9/00* | (2006.01) | |
| *H04B 1/16* | (2006.01) | |
| *H03H 9/64* | (2006.01) | |
| *H04B 1/10* | (2006.01) | |

(52) U.S. Cl.
CPC ............ *H04B 1/16* (2013.01); *H03H 9/64* (2013.01); *H04B 1/10* (2013.01)

(58) Field of Classification Search
CPC .............. H04B 1/16; H04B 1/10; H04H 9/64
USPC ........................................................ 375/316
See application file for complete search history.

(56) References Cited

U.S. PATENT DOCUMENTS

| | | | |
|---|---|---|---|
| 6,363,262 B1* | 3/2002 | McNicol | H04B 1/0003 375/E1.002 |
| 7,106,388 B2 | 9/2006 | Vorenkamp et al. | |
| 2005/0245201 A1 | 11/2005 | Ella et al. | |
| 2007/0066254 A1* | 3/2007 | Tsuchie | H04B 1/0014 455/183.2 |
| 2008/0242235 A1* | 10/2008 | Adler | H04B 1/006 455/73 |
| 2009/0180466 A1* | 7/2009 | Soul | H03J 7/04 370/350 |
| 2010/0197263 A1* | 8/2010 | Dwyer | H04B 7/12 455/272 |
| 2016/0021552 A1 | 1/2016 | Xu et al. | |

FOREIGN PATENT DOCUMENTS

| | | |
|---|---|---|
| CN | 1951006 A | 4/2007 |
| CN | 101583210 A | 11/2009 |
| CN | 101741803 A | 6/2010 |
| CN | 102201799 A | 9/2011 |
| CN | 106537969 A | 3/2017 |

* cited by examiner

*Primary Examiner* — Helene E Tayong

(57) ABSTRACT

A system and method for frequency-agnostic multiband aggregation of received signals is disclosed for use in high capacity communication. The system includes two up-conversion mixer stages and one down-conversion mixer stage, with SAW filter banks or other band pass filter banks used to select frequency bands of interest for aggregation based on configurable multiband combination settings. The method provides for the design of optimal multiband aggregation configuration settings.

15 Claims, 13 Drawing Sheets

MULTIBAND AGGREGATION RECEIVER ARCHITECTURE

TECHNICAL FIELD

The present invention relates to a system and method for high speed communications, and, in particular embodiments, to a system and method for receiving and aggregating multiband wireless communication signals.

BACKGROUND

Conventional radio receiver architecture is frequency band-specific due to performance limitations in the radio-frequency (RF) front-end hardware components. Multiband receivers are generally implemented by using multiple parallel radio-frequency analog-to-digital converter (RF-ADC) branches per receiver (Rx) branch.

FIG. 1 shows a conventional multiband radio receiver super-heterodyne architecture 100 known in the art. An RF front-end hardware unit 110 including an antenna 112 provides an input signal 108 to a plurality of RF-ADC branches 102,104,106. Each RF-ADC branch 102,104,106 includes an RF front-end filter 114, a low-noise amplifier (LNA) 116, a first mixer 118 receiving local oscillator input from a first local oscillator (LO) 120, an image-reject filter 122, a second mixer 124 receiving input from a second LO 126, a channel-select filter 128, and an analog-to-digital converter (ADC) 130.

However, once the number of receiver branches becomes very large, such as in a massive-multiple-input multiple-output (M-MIMO) configuration (e.g. 64+Rx branches), this conventional architecture may encounter problems of scalability and cost-effectiveness. It might be difficult to design a single, frequency-agnostic multiband radio device based on this conventional architecture covering a large RF range, such as the sub-6 GHz RF range: within the sub-6 GHz range, there are many possible multiband combinations, and the conventional architecture may not be able to flexibly support all these multiband combinations through software configuration using the same hardware.

A phalanx radio architecture has been disclosed which achieves multiband aggregation for applications such as cell tower antennas: US Patent Application Publication US 2016/0021552 A1, "Phalanx Radio System Architecture for High Capacity Wireless Communication", filed Jul. 17, 2014, hereby incorporated by reference in its entirety.

An example of the disclosed phalanx radio architecture 200 is shown in FIG. 2. Each Rx branch 204 includes band-pass filter block 209 consisting of one band pass filter per band in the multiband input signal. The output of these branches 204 is combined by a combiner 212, which provides the combined signal 214 to a high speed ADC 216 clocked by a clock unit 218 to produce a combined digital output signal 220. In this example architecture 200, the band-pass filters 209 are band-specific for each branch 204: they are not frequency band-agnostic.

However, the previously disclosed phalanx radio architecture is limited to preconfigured multiband combinations, and may not be sufficiently flexible to support a large number of multiband combinations. FIG. 3 shows an example of the operation of the previously disclosed phalanx radio architecture 200. The signals received by four Rx branches 302,304,306,308 are shown, both before 310 and after 312 processing by the band-select and packing processes of each Rx branch 302,304,306,308. On the right at input frequency range 310, the pre-processed signals are shown to each have three frequency bands 320,322,324 of interest that overlap for each of the four branches 302,304, 306,308. The frequency of each LO 330,332,334,336 corresponding to each of the four branches 302,304,306,308 is also shown in range 310.

After being processed by the band-select and packing process, these bands of interest 320,322,324 are re-centered within the left range 312 in non-overlapping frequencies. When combined by the combiner 212 into combined signal 214, these bands 320,322,324 from each of the four branches 302,304,306,308 are encoded in the combined signal 214 at non-overlapping frequencies.

However, this aggregation method requires that the bands 320,322,324 have specific bandwidths (BW) and specific frequency gaps between them in order to effectively combine them into the combined signal 214. The number of multiband combinations this method and architecture can support may therefore be limited.

SUMMARY OF THE INVENTION

In accordance with an embodiment, a system for high capacity communication is disclosed. The system comprises at least one receiver branch. Each receiver branch comprises a second mixer stage comprising a plurality of sections. Each section comprises a second-stage mixer configured to receive a second-stage input signal and down-convert the signal to a second-stage frequency value, and a filter bank for routing the down-converted signal through a selected filter of a plurality of band pass filters. Each band pass filter has a bandwidth and a center frequency, and the filter bank is configured to select any one of the plurality of band pass filters based on received configuration instructions.

In accordance with another embodiment, a method for optimizing the design of band pass filter banks for a frequency-agnostic M-band multiband receiver is disclosed. The method comprises the following steps. First, providing a plurality of filter banks configured to set center frequencies for the frequency bands based on bandwidth values for the bands so as to produce a plurality of multiband combinations. Second, for each multiband combination having a total carrier bandwidth below a predetermined threshold (CBW-max), calculating parameters for each band, as follows: setting a frequency offset value for each frequency band to zero; setting a center frequency value for a first frequency band equal to a predetermined starting frequency for the predetermined frequency range, plus half the bandwidth of the first frequency band, plus the offset value for the first band; setting a center frequency value for a each frequency band of the second through Mth frequency band equal to the center frequency of the frequency band prior to the current band, plus half the bandwidth of the frequency band prior to the current band, plus a predetermined minimum frequency gap value, plus half the bandwidth of the current frequency band, plus the current band offset value; increasing the first band offset value to set the value of (first band offset plus first band bandwidth plus second band bandwidth) equal to said sum for each multiband combination having the same second band bandwidth; and, for each of the third through Mth band, increasing the current band offset value to set the value of (the sum of the first through current band offsets plus the sum of the first through current band bandwidths) equal to said sum for each multiband combination having the same current band bandwidth.

Further example embodiments of the claimed subject matter will be appreciated from the following detailed description and drawings.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF ILLUSTRATIVE EMBODIMENTS

Figure 1:
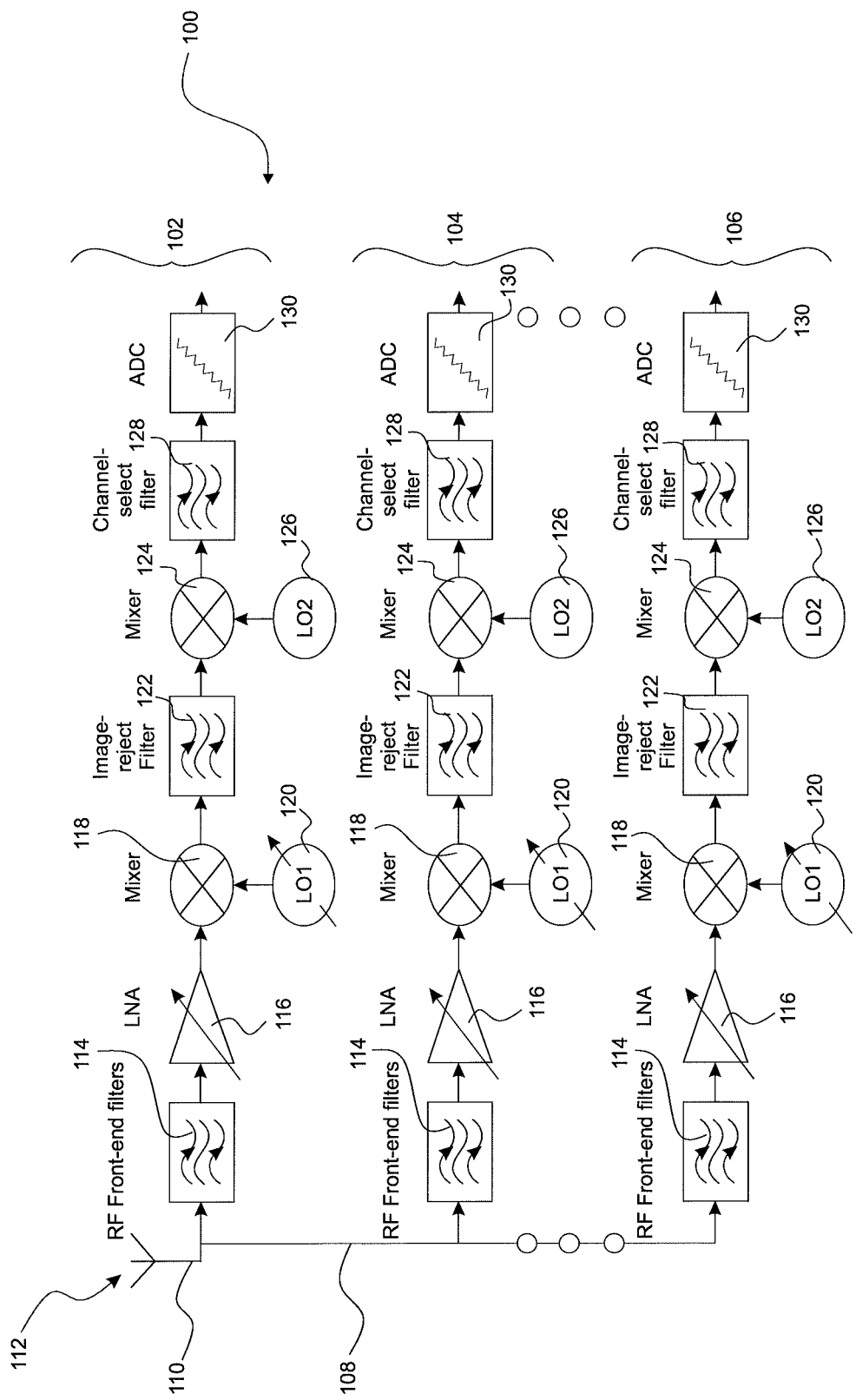
FIG. 1 is a block diagram of a conventional multiband radio receiver architecture known in the art.
Figure 2:
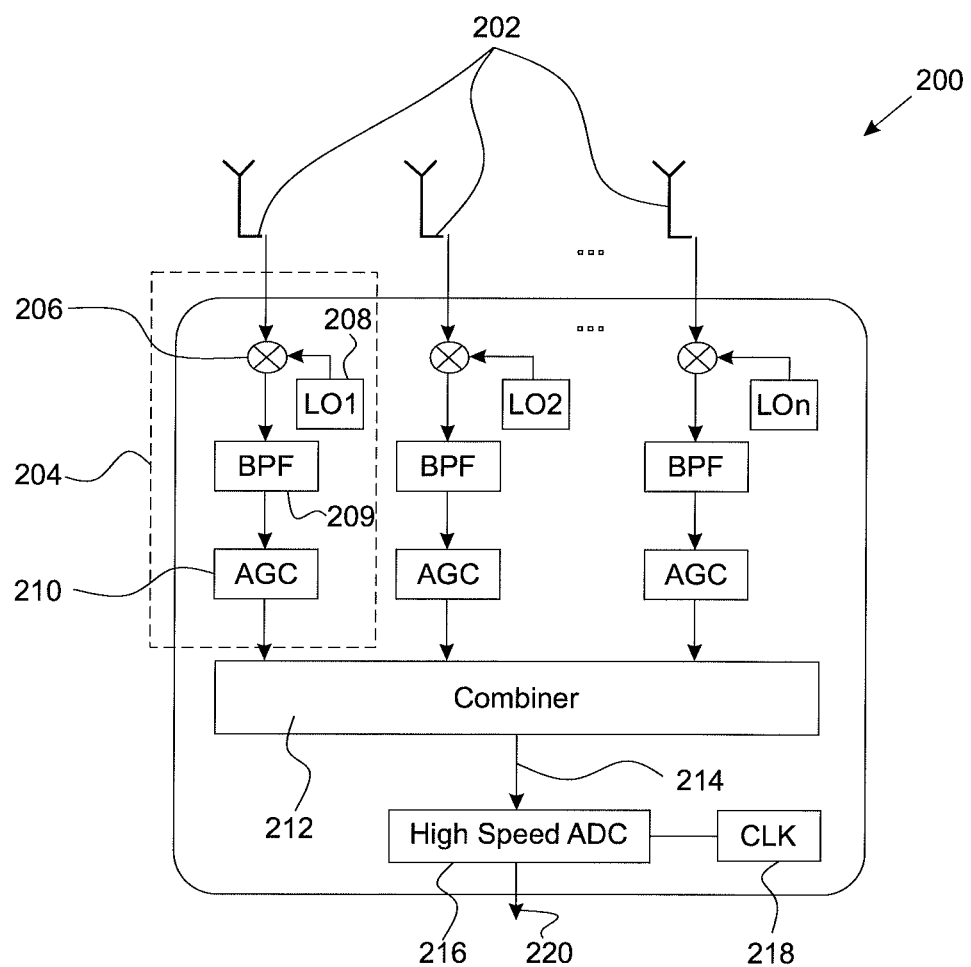
FIG. 2 is a block diagram of an example phalanx radio architecture known in the art.
Figure 3:
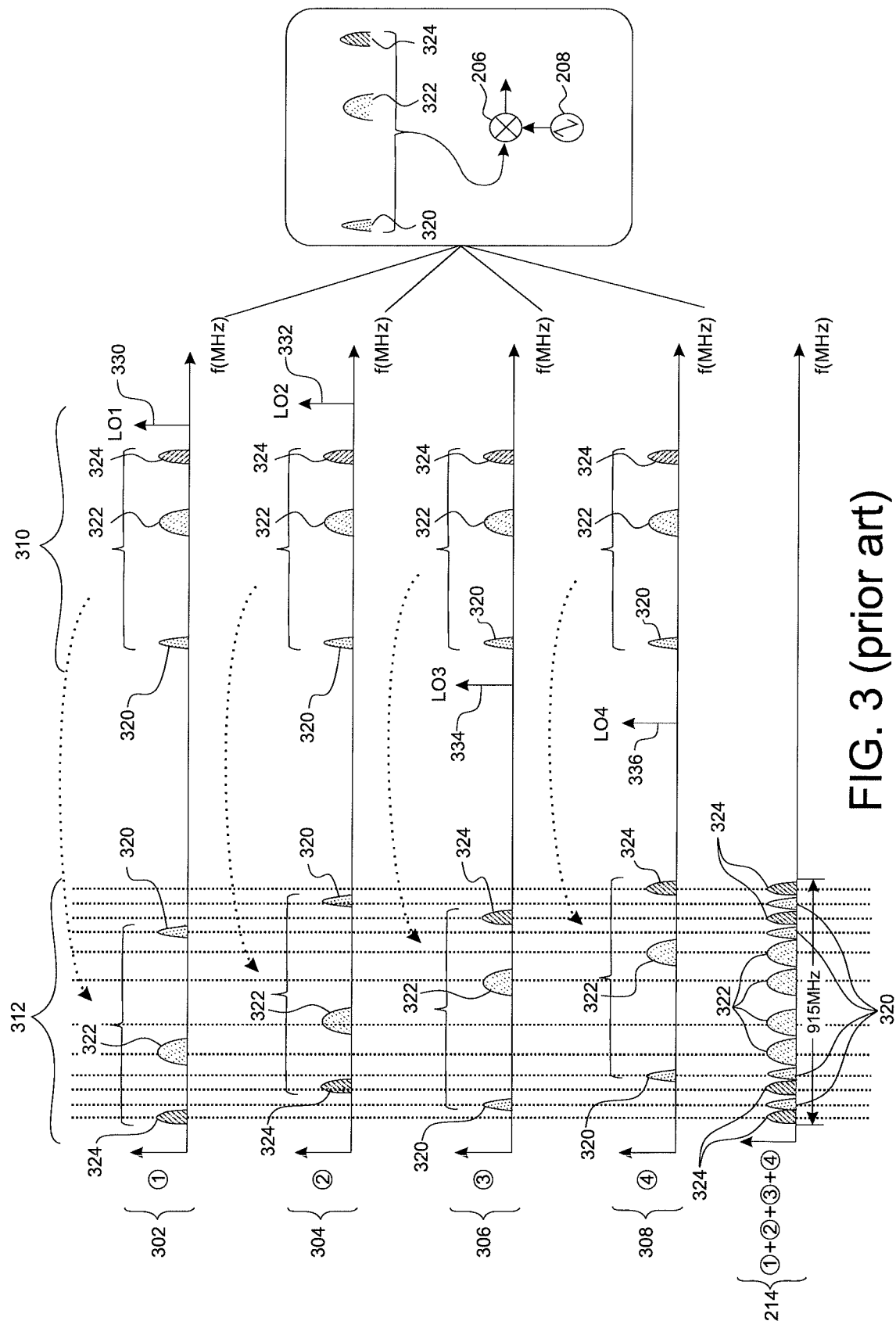
FIG. 3 is a diagram showing four frequency-domain plots of signals before and after being processed by four receiver branches of the example known phalanx radio architecture of FIG. 2, along with a plot combining those four signals.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Disclosed herein are systems and methods for a frequency-agnostic multiband aggregation receiver architecture (FAMARA) for aggregating communication signals received over one or more communication links by multiple front-end hardware units such as radio units (RUs) or other receiver hardware. The architecture is theoretically capable of supporting any multiband combinations within a predetermined frequency range. These example systems and methods could be used in a number of applications, including wireless infrastructure/base stations or user equipment. In some embodiments, they may enable use of common radio hardware at a central cloud location to be frequency-agnostic and to support arbitrary multiband combinations using receiver aggregation. In some embodiments, this may offer benefits for operators, including: (1) reducing an operator's logistical complications and costs by eliminating the many radio hardware variances required to handle multiple frequency bands and multiband combinations; (2) enabling an operator's ease-of-use and ease-of-deployment by deploying and configuring a common radio hardware portion at a central cloud location, using a generalizable method (described in detail below) for determining an optimal configuration for the desired multiband combination; and (3) reducing hardware costs, particularly for massive-multi-input-multi-output (M-MIMO), owing to the use of multiband receiver aggregation into single analog-digital converter (ADC), which is often the most expensive component in the radio.

Table 1 below shows a typical sub-6 GHz radio-spectrum allocation scheme, with individual numbered bands (e.g. Band 33) indicated by a start frequency (e.g. 1900 MHz), end frequency (e.g. 1920 MHz), and bandwidth (e.g. 20 MHz). In such a scheme, each operator generally owns only part of the spectrum in a given band and not the entire band: thus, multiple operators may own portions of the 60 MHz bandwidth of Band 35, or portions of the 100 MHz bandwidth of Band 40. Therefore, the possible number of multiband combinations is potentially very large and may also vary by region.

TABLE 1

| Band # | Start Freq [MHz] | End Freq [MHz] | BW [MHz] |
| --- | --- | --- | --- |
| 44 | 703 | 803 | 100 |
| 51 | 1427 | 1432 | 5 |
| 50 | 1432 | 1517 | 85 |
| 45 | 1447 | 1467 | 20 |
| 35 | 1850 | 1910 | 60 |
| 39 | 1880 | 1920 | 40 |
| 33 | 1900 | 1920 | 20 |
| 37 | 1910 | 1930 | 20 |
| 36 | 1930 | 1990 | 60 |
| 34 | 2010 | 2025 | 15 |
| 40 | 2300 | 2400 | 100 |
| 41 | 2496 | 2690 | 194 |
| 38 | 2570 | 2620 | 50 |
| 42 | 3400 | 3600 | 200 |
| 48 | 3550 | 3700 | 150 |
| 43 | 3600 | 3800 | 200 |
| 46 | 5150 | 5925 | 775 |
| 47 | 5855 | 5925 | 70 |

It may therefore be cost-effective for operators to deploy a single radio hardware unit which could flexibly support the various multiband combinations without requiring multiple unique radio hardware units.

Figure 4:
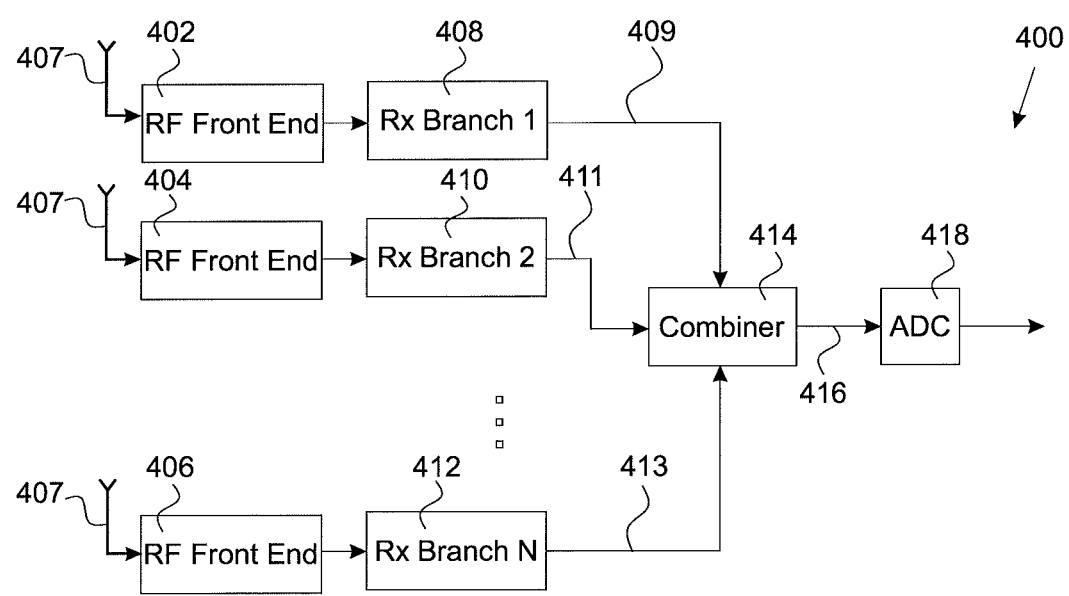
FIG. 4 is a block diagram of an embodiment of a frequency-agnostic multiband aggregation radio architecture according to the present disclosure.

With reference to the drawings, FIG. 4 shows the overall multiband receiver system 400 according to an embodiment. The receiver system 400 consists of N number of RF front-end units (first RF unit 402, second RF unit 404, and Nth RF unit 406 are illustrated) with antennas 407 providing RF front-end radio capability to N number of receiver (Rx) branches (first Rx branch 408, second Rx branch 410, and Nth Rx branch 412 are illustrated). A branch signal combiner 414 combines the outputs 409,411, . . . 413 of each of the Rx branches 408,410, . . . 412 before passing the resulting combined signal 416 to a single analog-to-digital converter (ADC) 418. This architecture allows a single ADC 418 to be used for a large number N of Rx branches 408,410, . . . 412, potentially resulting in significant cost savings.

In some embodiments, the value chosen for N may be limited by the input bandwidth of the ADC hardware used. The larger the supported bandwidth of a single ADC, the more receiver branches can theoretically have their output aggregated for processing by the ADC. This may achieve cost reduction by reducing the number of ADC hardware units used by the system.

Figure 5:
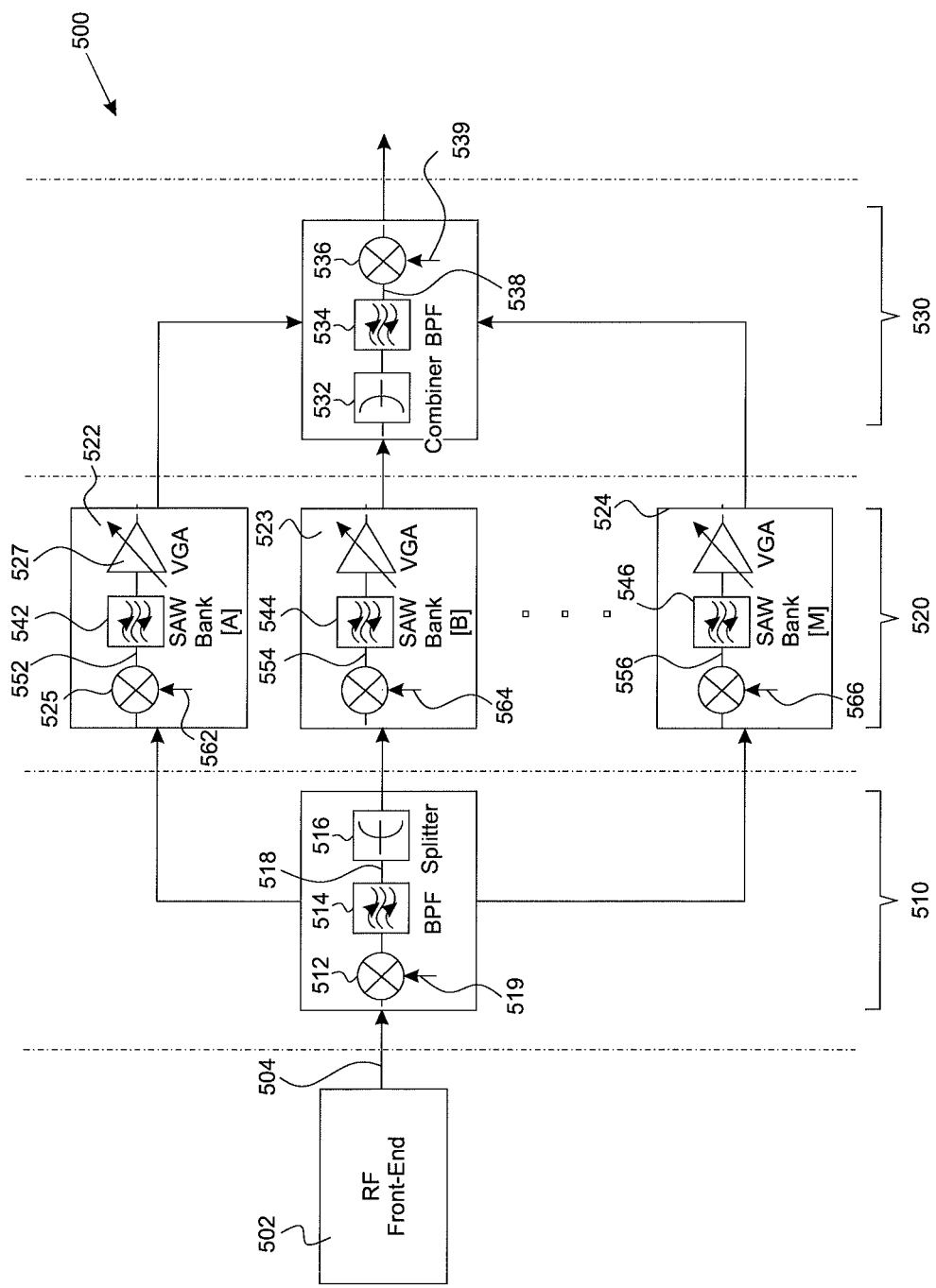
FIG. 5 is a block diagram of an embodiment of a single receiver branch of a frequency-agnostic multiband aggregation radio architecture according to the present disclosure.

FIG. 5 shows a multiband Rx branch 500 according to an embodiment. The example receiver system 400 illustrated in FIG. 4 could in some embodiments use this multiband Rx branch 500 to implement one or more of the illustrated Rx branches 408,410, . . . 412.

The multiband Rx branch 500 functions to isolate each frequency band in a multiband input signal 504 received from an RF front-end unit 502, then pack the isolated bands by re-centering each band in the frequency domain in order to aggregate the selected bands into the combined signal output 416 of the receiver system 400. These functions are carried out by three mixer stages of the Rx branch 500: a first mixer stage 510 (also referred to as the "up-conversion mixer stage"), a second mixer stage 520 (also referred to as the "band-isolation mixer stage"), and a third mixer stage 530 (also referred to as the "band combination stage").

The first mixer stage 510 performs an up-conversion of the frequency of the detected bands in the input signal 504 from the RF front-end unit 502. The second mixer stage 520 and third mixer stage 530 perform down-conversion. In the embodiments of FIG. 4-8, the first mixer stage 510 operates to up-convert the multiband input signal and remove noise spurs. The second mixer stage 520 operates to down-convert the clean signal and isolate each of a plurality of bands from the multiband signal resulting in the bands packed together into a group with bands adjacent to each other, using a plurality of configurable band-pass filter banks to accommodate a number of different multiband combinations. The third stage 530 operates to down-convert the isolated band group to a predetermined frequency range required to enable combiner 414 in FIG. 4 to further pack all the band groups together.

An example Rx branch 500 may be configured to select and pack a number of bands, M. In some embodiments, the value chosen for M may be limited by the bandwidth capacity of the front-end communication units (e.g. the RF front-end units 502), and by the number of multiband combinations to be supported within the system's operational frequency range.

The example embodiments described in detail below feature a three-band configuration (M=3) wherein each Rx branch 500 selects and packs three bands from the received signal 504, with the output 416 of the combiner 414 of the receiver system 400 containing an aggregation of M×N bands, M bands for each of N Rx branches 408,410, . . . 412.

With reference to the embodiment of FIG. 5, the first mixer stage 510 includes a mixer 512 receiving input from a first-stage LO 519; in some embodiments, this first-stage LO 519 may be the same LO used for each of the N Rx branches 408,410, . . . 412. A first-stage band-pass filter 514 filters the signal, producing first-stage post-mixer signal 518. This is then split by a splitter 516 to produce M number of output signals sent as input to each of M sections of the second mixer stage 520.

Figure 6:
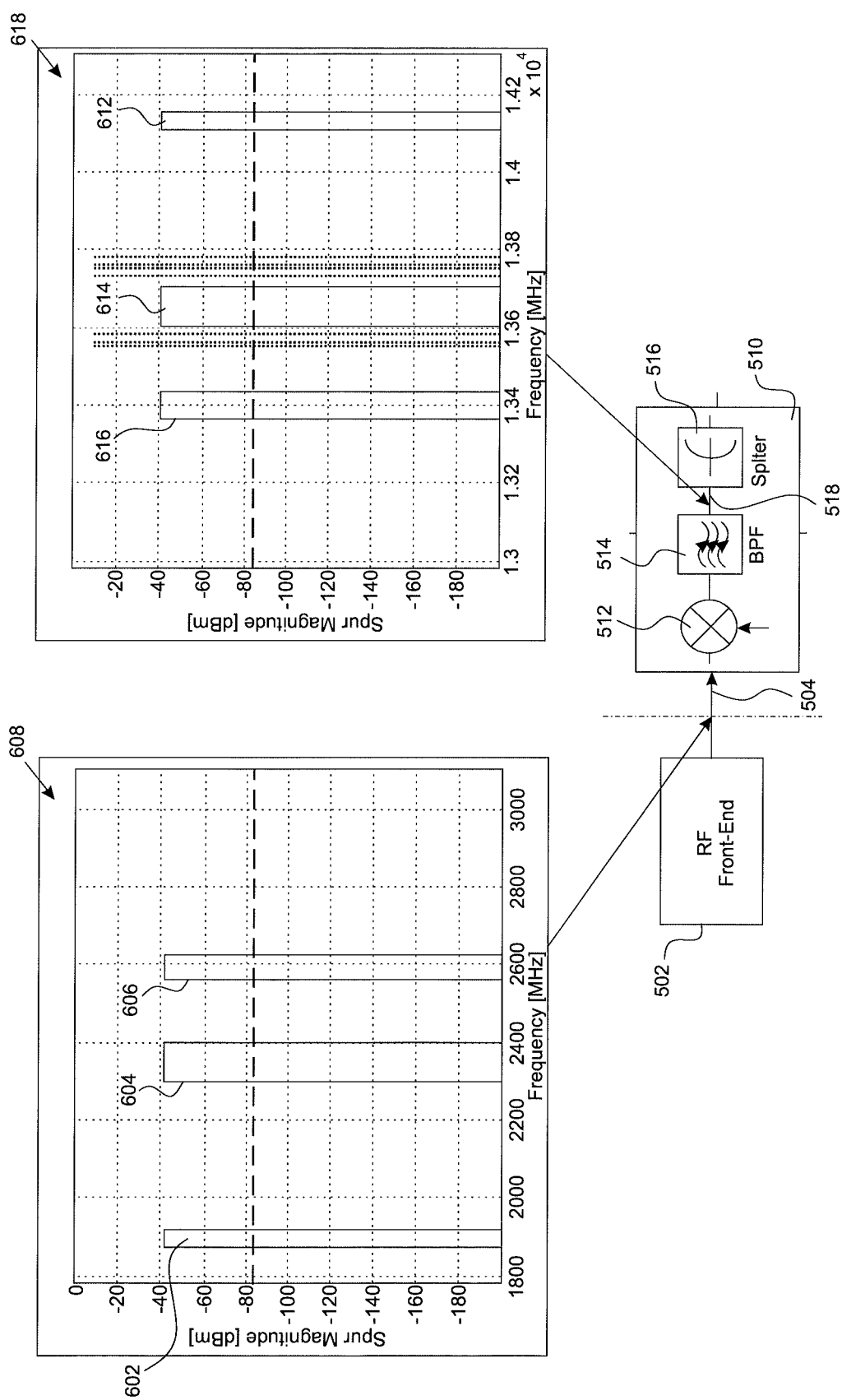
FIG. 6 is a block diagram of an embodiment of an RF front-end and first mixer stage of the receiver branch of FIG. 5, showing plots of the signals produced by the RF front-end and by the filter of the first mixer section.

The up-conversion by the mixer 512 of the first mixer stage 510 normalizes the frequency band of the received signal by re-centering it in a higher frequency range. This allows flexible frequency planning for the various multiband combinations. By re-centering the received signal in a different frequency range, the receiver is able to minimize the risk of in-band noise spurs. FIG. 6 shows a frequency domain plot 602 of an example multiband input signal 504 received from the RF front-end unit 502, showing three bands centered at three frequencies: a first band 602 centered at approximately 1900 MHz, a second band 604 centered at approximately 2350 MHz, and a third band 606 centered at approximately 2600 MHz. The first-stage mixer 512 up-converts the multiband signal 504 to the range of approximately 13,400-14,100 MHz in this embodiment; the up-converted signal is then passed through first-stage band pass filter 514 to remove critical unwanted spurs outside of the 12,000-14,500 MHz range in this embodiment. The resulting first-stage post-mixer signal 518 exhibits the three bands 602,604,606 up-converted to these higher frequencies and filtered for noise spurs, as plotted in plot 618: the first band 612 is now centered at approximately 14,100 MHz, the second band 614 at approximately 13,650 MHz, and the third band 616 at approximately 13,400 MHz.

With reference again to the embodiment of FIG. 5, the second mixer stage 520 includes M sections corresponding to M frequency bands of interest: in this embodiment, M is equal to 3 and three sections 522,523,524 are shown. Each section 522,523,524 has a mixer 525 receiving input from a second-stage LO 562,564,566 and performing down-conversion; in this example embodiment, the bands of interest in the input signal are down-converted from approximately the 13,400-14,100 MHz range to a frequency range most conducive to the operation of a bank of band-pass filters, such as a SAW filter bank, to select bands of interest, such as the range of 1890-2140 MHz. In some embodiments, these second-stage LOs 562,564,566 are distinct as to each of the M sections of a given Rx branch 500, but may be shared by each of the corresponding sections in each of the N branches. Thus, the same second-stage LO 562 may be used by the first section 522 of a first Rx branch 408, by the first section 522 of a second Rx branch 410, and so on up to Rx branch N 412.

Figure 7A:
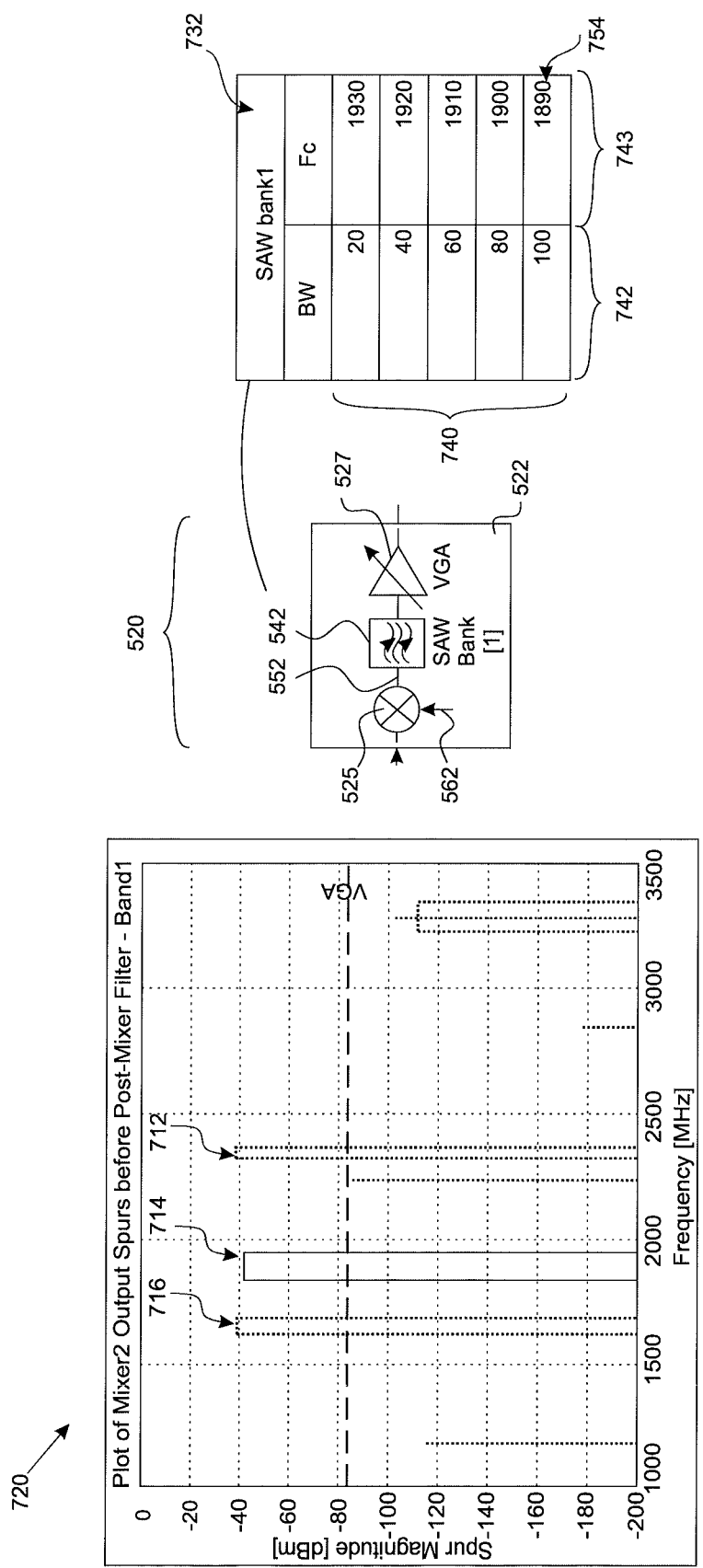
FIGS. 7A, 7B and 7C are block diagrams of an embodiment of a three-band (M=3) second mixer stage of the receiver branch of FIG. 5, showing plots of the signals produced by the mixers of each of the three sections of the second mixer stage along with tables listing the bandwidth (BW) and center-frequencies ($F_c$) of the SAW banks employed by the filters of each of the three sections.
Figure 7B:
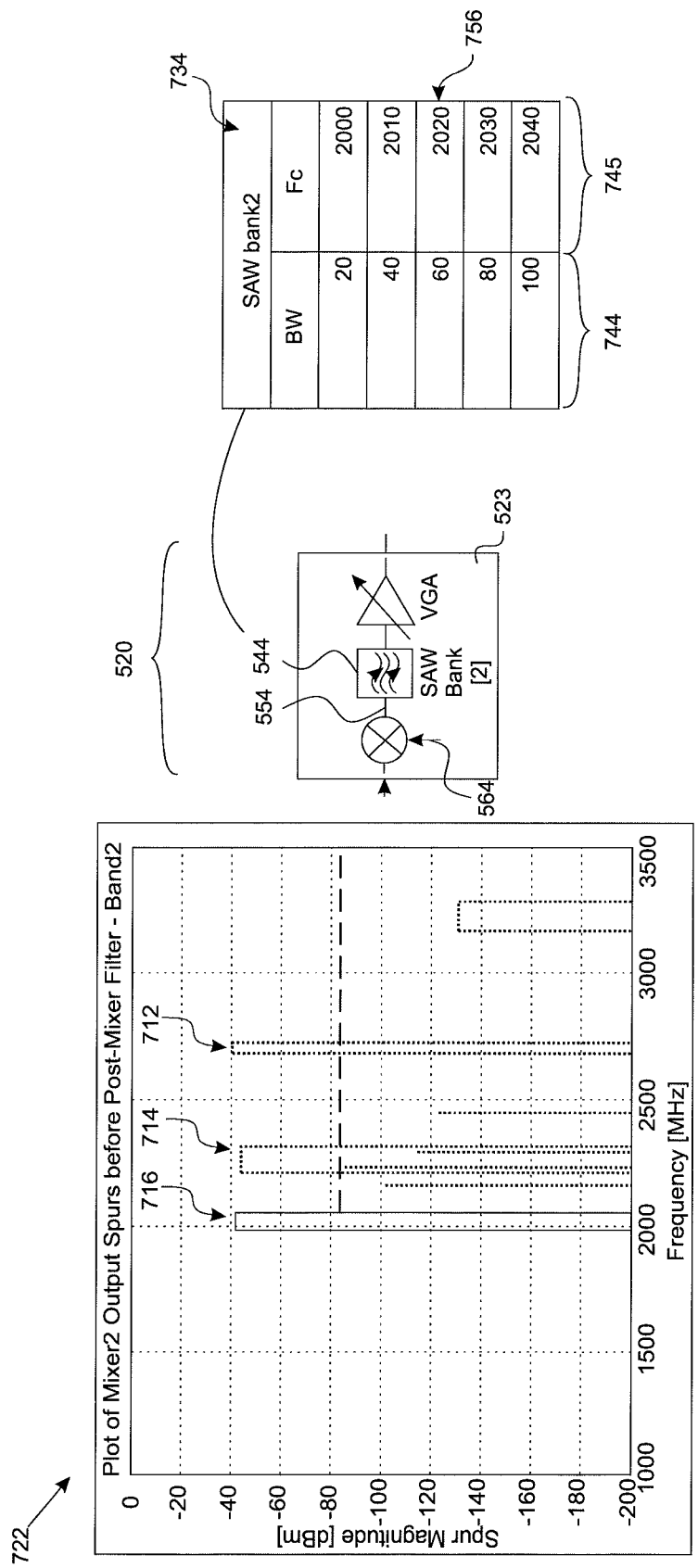
Figure 7C:
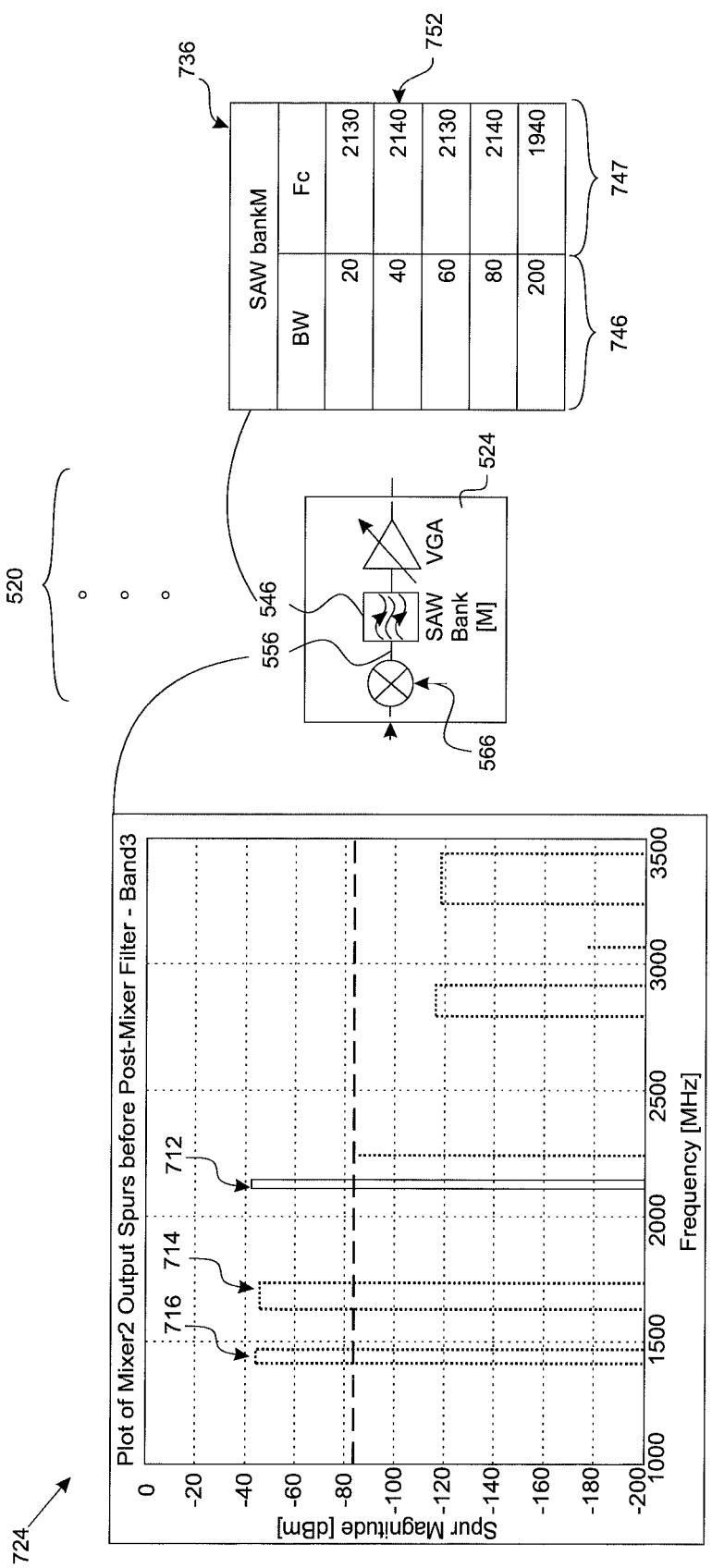

Each section 522,523,524 also has a corresponding bank of band-pass filters, such as a surface acoustic wave (SAW) filter bank 542,544,546. Each filter bank 542,544,546 comprises a plurality of band pass filters, each having a bandwidth (BW) and a center frequency ($F_c$) characterizing its operation. This M number of SAW filter banks 542,544,546 are used by the M sections 522,523,524 of the second mixer stage 520 for multiband selection: each section 522,523,524 of the second mixer stage 520, using its own SAW filter bank 542,544,546, enables support of one band in a multiband receiver, thereby potentially supporting a large number M of frequency bands within a single Rx branch 500. With reference to FIG. 7A-7C, the example second mixer stage 520 from FIG. 5 is shown alongside plots of input signals and SAW filter banks corresponding to each of the M=3 sections of the second mixer stage 520. In FIG. 7A, the first section 522 is shown alongside a plot 720 of the first pre-SAW bank signal 552 showing the three frequency bands 712,714,716 corresponding to the first, second, and third bands 602,604,606 from FIG. 6, after being down-converted by the second mixer stage mixer 525 from the roughly 13,400-14,100 MHz range of plot 618 to the roughly 1800-2200 MHz range of plots 720,722,724. The first section 522 receives the first split portion of the split signal produced by the splitter 516 of the first mixer stage: only one of the bands (second band 714) in plot 720 is propagated by the chosen SAW filter 754 within the SAW bank 542. The SAW filter bank 542 applied by the first section 522 uses bandwidth values 742 and center frequency ($F_c$) values 743 set out in the first SAW bank table 732 to select this frequency band 714 present in first pre-SAW bank signal 552: specifically, the SAW filter 754 is used in this example to select the frequency band centered at 1890 MHz with a bandwidth of 100 MHz. Similarly, in FIG. 7B-7C, each of the other (M−1=2) sections 523,524 has a corresponding SAW filter bank 543,544 using bandwidth values 744,746 and $F_c$ values 745,747 set out in the corresponding SAW bank tables 734,736 and uses its SAW filter bank 544,546 to select the frequency band 716,712 present in first pre-SAW bank signal 554,556. Each section 522,523,524 in this embodiment also has a variable gain amplifier (VGA) 527 to level the amplitudes of the selected bands relative to each other to achieve the required gain flatness.

The down-conversion by the second mixer stage 520 centers each band 712,714,716 in the multiband signal to the specific frequencies defined by the applicable SAW filter bank 542,544,546. This accomplishes the function of band selection for later aggregation. In some embodiment, using SAW filter banks 542,544,546 with multiple different bandwidth values 742,744,746 (e.g. 20/40/60/80/100/200/etc. MHz) enables flexibility in supporting bands having different bandwidths. In a case where a frequency band has a bandwidth that falls between two available filter bandwidth options, the filter with the next higher available filter bandwidth value can be used.

Five SAW filters 740 are shown in FIG. 7A-7C for each SAW filter bank 542,544,546. However, other embodiments may have fewer or more than five SAW filters 740 in each SAW filter bank. (The number of SAW filters 740 in each SAW filter bank may be denoted by P, with the illustrated embodiments having P=5.)

In some embodiments, the set of M SAW filter banks 542,544, . . . 546 used by the M sections 522,523, . . . 524 of the second mixer stage 520 may use the same configuration settings as the M SAW filter banks 542,544, . . . 546 of the second mixer stage 520 of each of the N Rx branches 408,410, . . . 412. In such an embodiment, the selection of a SAW filter bank option for each Rx branch 408,410,412 may be identical. Thus, the SAW filter 740 selected from the SAW filter bank options for the SAW filter bank 542 of a first section 522 of a first Rx branch 408 is the same SAW filter 740 (with, e.g., the same bandwidth and center frequency) selected from the SAW filter bank options of the corresponding SAW filter bank 542 of the first section 522 of a second Rx branch 410. This allows each Rx branch 408,410, . . . 412 to process a received multi-band signal having the same multi-band configuration as each other Rx branch.

Figure 10:
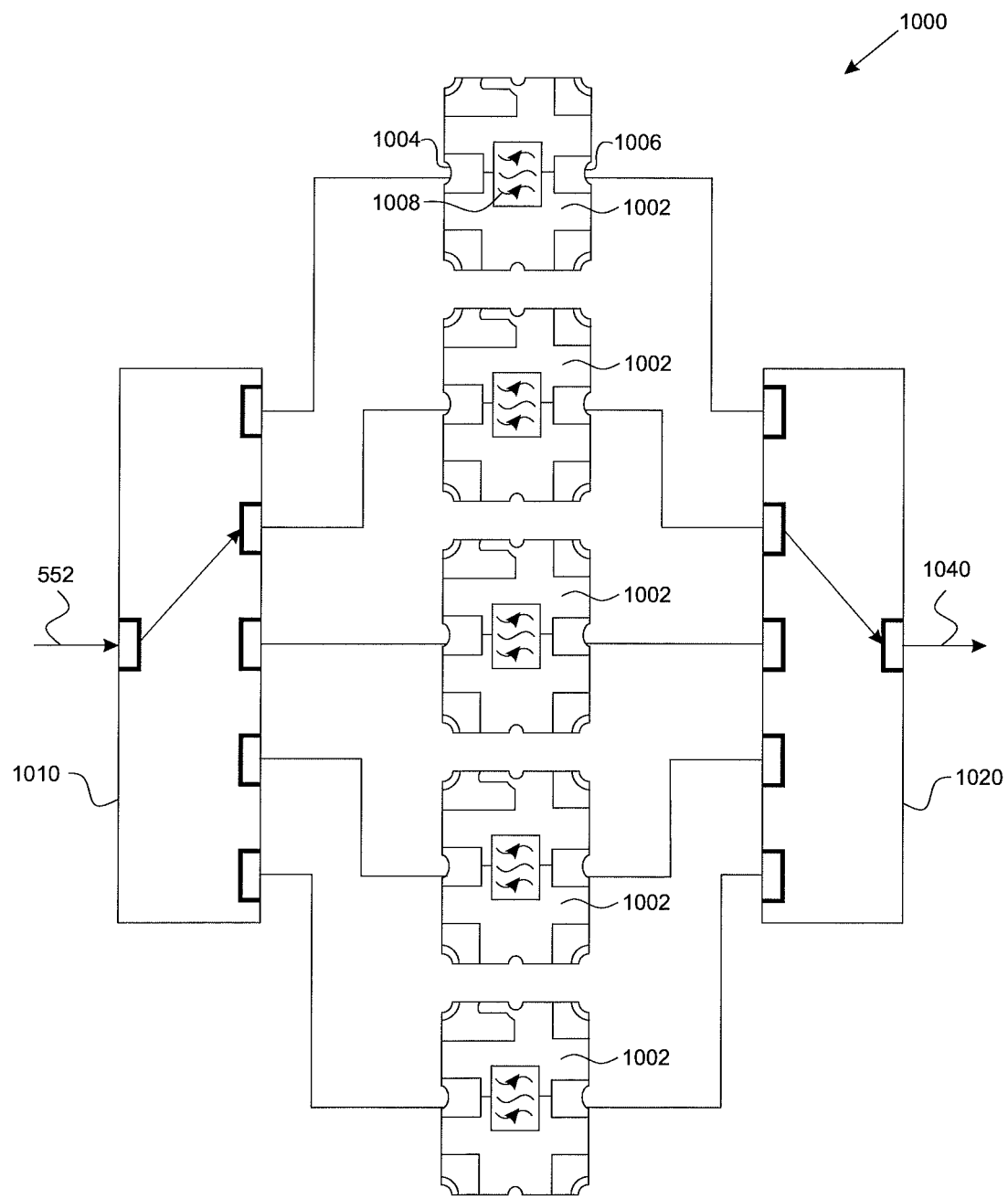
FIG. 10 is an example circuit diagram of a SAW filter bank consisting of 5 SAW filters corresponding to bandwidths of 20, 40, 60, 80 and 100 MHz, as used in the second mixer stage of a receiver branch according to an example embodiment.

FIG. 10 shows an example implementation of a SAW filter bank 1000 used by a section (e.g. 522) of the second mixer stage 520. The SAW filter bank 1000 has five SAW filters 1002 (P=5) corresponding to five different bandwidths, e.g. bandwidths of 20, 40, 60, 80 and 100 MHz, and five different center frequencies ($F_c$), e.g. 1930, 1920, 1910, 1900, and 1890 MHz. In other embodiments, the number of SAW filters P may be different from five. In some embodiments, the bandwidths and/or $F_c$ of the SAW filters may be different from the example given (i.e. bandwidths of 20, 40, 60, 80 and 100 MHz, and $F_c$ of 1930, 1920, 1910, 1900, and 1890 MHz). A first RF switch 1010 and second RF switch 1020 determine which SAW filter within the SAW filter bank 1002 is used to filter the pre-filter signal 552 at the section 522 the second mixer stage 520 employing the SAW filter bank 1000. Each SAW filter 1002 has an input 1004, an output 1006, and a filter 1008 with predetermined bandwidth 742 and $F_c$ 743 characteristics as set out, e.g., in SAW bank table 732. Each SAW filter 1002 thus corresponds to one of the SAW filters 740 in e.g. SAW bank table 732. The SAW filter bank 1000 produces a SAW filter bank output signal 1040, which is received by the VGA 527.

In example embodiments of a receiver branch 500, the $F_c$ of the various SAW filters in the filter bank are defined to enable support of any multiband combinations of 20/40/60/80/100/200 MHz bandwidth band(s) with a total aggregated bandwidth of 200 MHz. Table 2 below shows the 26 supported combinations of SAW bank filter options in such an embodiment wherein M=3 for single, dual, and triband support; however, as discussed above, in other embodiments the architecture can be scaled to more than three bands (M>3) with different bandwidth options. The entries in Table 2 correspond to different combinations of SAW filter bank filter options according to the example SAW filter bank values from FIG. 7A-7C set out in SAW bank tables 732,734,736. Each of the 26 rows in Table 2 corresponds to a unique combination of SAW bank filters 740 from each of tables 732,734,736: column "Bank1-BW1" corresponds to bandwidth options 742 from table 732; column "Bank2-BW2" corresponds to bandwidth options 744 from table 734; column "Bank3-BW3" corresponds to bandwidth options 746 from table 736; column "Bank1-Fc1" corresponds to $F_c$ options 743 from table 732; column "Bank2-Fc2" corresponds to $F_c$ options 745 from table 734; column "Bank3-Fc3" corresponds to $F_c$ options 747 from table 736. The other columns indicate either input parameters or intermediate values used to derive the target bandwidth and $F_c$ values, as set out in further detail below.

TABLE 2

| IF2 Filter Bank Usage | | | | | | IF2 Filter Bank Fc | | | | | |
|---|---|---|---|---|---|---|---|---|---|---|---|
| Bank1-BW1 | Bank2-BW2 | Bank3-BW3 | Offset1 | Offset2 | Offset3 | Bank1-Fc1 | Bank2-Fc2 | Bank3-Fc3 | BW | Gap1 | Gap2 |
| 0 | 0 | 200 | 0 | 0 | 0 | 0 | 0 | 1940 | 200 | 0 | 0 |
| 100 | 100 | 0 | 0 | 0 | 0 | 1890 | 2040 | 0 | 250 | 50 | 0 |
| 100 | 80 | 20 | 0 | 0 | 0 | 1890 | 2030 | 2130 | 300 | 50 | 50 |
| 100 | 60 | 40 | 0 | 0 | 20 | 1890 | 2020 | 2140 | 320 | 50 | 70 |
| 100 | 60 | 20 | 0 | 0 | 20 | 1890 | 2020 | 2130 | 300 | 50 | 70 |
| 100 | 40 | 40 | 0 | 0 | 40 | 1890 | 2010 | 2140 | 320 | 50 | 90 |
| 100 | 40 | 20 | 0 | 0 | 50 | 1890 | 2010 | 2140 | 310 | 50 | 100 |
| 100 | 20 | 20 | 0 | 0 | 60 | 1890 | 2000 | 2130 | 300 | 50 | 110 |
| 80 | 80 | 40 | 20 | 0 | 0 | 1900 | 2030 | 2140 | 300 | 50 | 50 |
| 80 | 80 | 20 | 20 | 0 | 0 | 1900 | 2030 | 2130 | 280 | 50 | 50 |
| 80 | 60 | 60 | 20 | 0 | 0 | 1900 | 2020 | 2130 | 300 | 50 | 50 |
| 80 | 60 | 40 | 20 | 0 | 20 | 1900 | 2020 | 2140 | 300 | 50 | 70 |
| 80 | 60 | 20 | 20 | 0 | 20 | 1900 | 2020 | 2130 | 280 | 50 | 70 |

TABLE 2-continued

| IF2 Filter Bank Usage | | | | | | IF2 Filter Bank Fc | | | | | |
|---|---|---|---|---|---|---|---|---|---|---|---|
| Bank1-BW1 | Bank2-BW2 | Bank3-BW3 | Offset1 | Offset2 | Offset3 | Bank1-Fc1 | Bank2-Fc2 | Bank3-Fc3 | BW | Gap1 | Gap2 |
| 80 | 40 | 40 | 20 | 0 | 40 | 1900 | 2010 | 2140 | 300 | 50 | 90 |
| 80 | 40 | 20 | 20 | 0 | 40 | 1900 | 2010 | 2130 | 280 | 50 | 90 |
| 80 | 20 | 20 | 20 | 0 | 60 | 1900 | 2000 | 2130 | 280 | 50 | 110 |
| 60 | 60 | 60 | 40 | 0 | 0 | 1910 | 2020 | 2130 | 280 | 50 | 50 |
| 60 | 60 | 40 | 40 | 0 | 20 | 1910 | 2020 | 2140 | 280 | 50 | 70 |
| 60 | 60 | 20 | 40 | 0 | 20 | 1910 | 2020 | 2130 | 260 | 50 | 70 |
| 60 | 40 | 40 | 40 | 0 | 40 | 1910 | 2010 | 2140 | 280 | 50 | 90 |
| 60 | 40 | 20 | 40 | 0 | 40 | 1910 | 2010 | 2130 | 260 | 50 | 90 |
| 60 | 20 | 20 | 40 | 0 | 60 | 1910 | 2000 | 2130 | 260 | 50 | 110 |
| 40 | 40 | 40 | 60 | 0 | 40 | 1920 | 2010 | 2140 | 260 | 50 | 90 |
| 40 | 40 | 20 | 60 | 0 | 40 | 1920 | 2010 | 2130 | 240 | 50 | 90 |
| 40 | 20 | 20 | 60 | 0 | 60 | 1920 | 2000 | 2130 | 240 | 50 | 110 |
| 20 | 20 | 20 | 80 | 0 | 60 | 1930 | 2000 | 2130 | 220 | 50 | 110 |

The example values of Table 2 illustrate single-band support (first row), dual-band support (second row), and tri-band support (remaining 24 rows).

Figure 11:
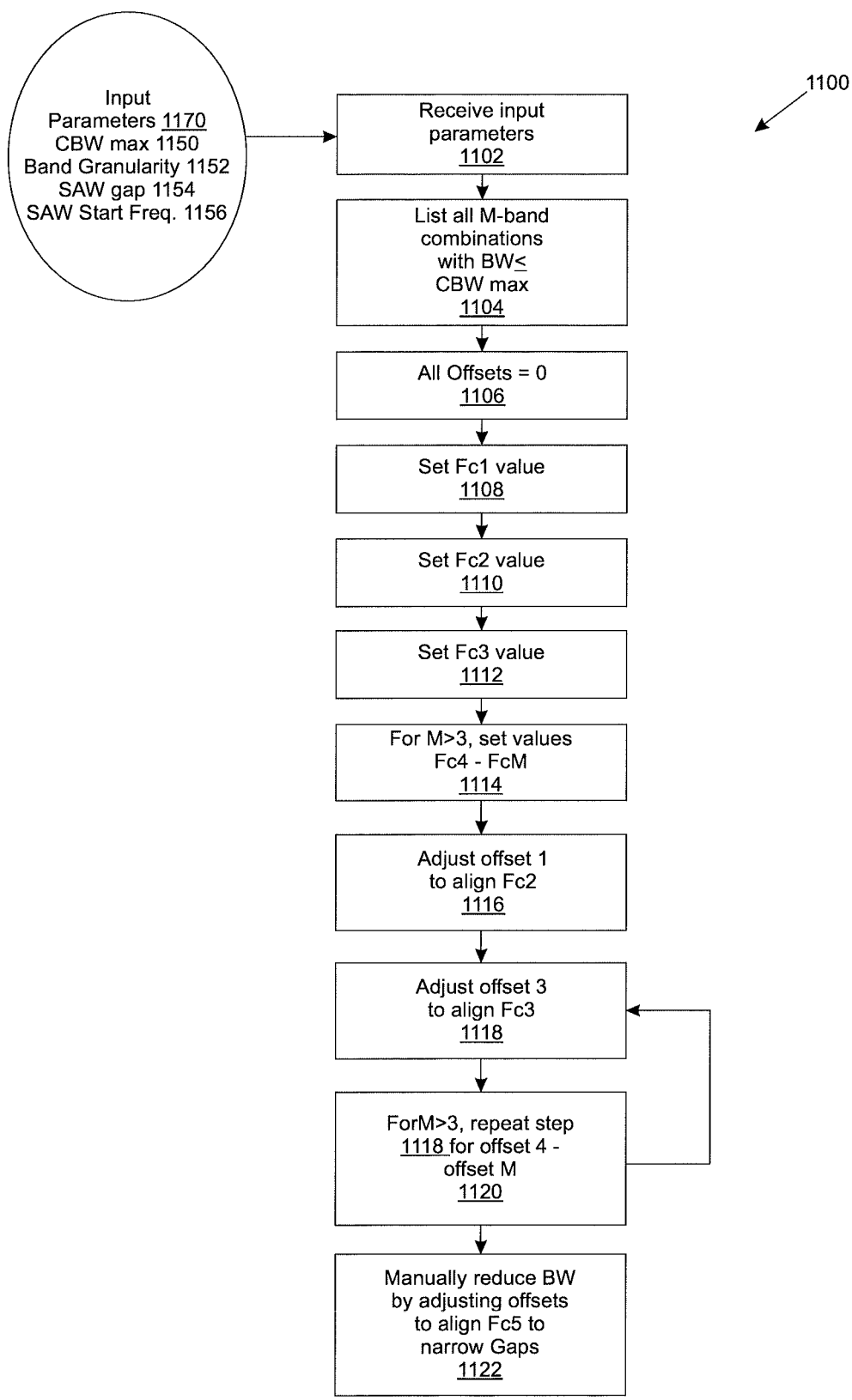
FIG. 11 is a flow chart showing the steps of a method for computing possible combinations of SAW filter bank options according to example embodiments.

In example embodiments, a method 1100 for computing the possible combinations of SAW bank filter options (such as those in Table 2 above for a receiver branch 500 with M=3 and the bandwidth and $F_c$ parameters indicated above) may be generalized for an M-band receiver branch as including several steps, set out in an example flowchart in FIG. 11. Once the possible SAW bank filter options have been computed, a system may be manufactured or coded having SAW filters with these options for BW and $F_c$ values. (For ease of reference, the example column names used in Table 2 may be shortened in the description below: "Bank1-BW1" is shortened to "BW1", "Bank1-Fc1" is shortened to "Fc1", and so on.)

The example method 1100 begins, at step 1102, with input parameters 1170 being provided that define the operating parameters of the system to be designed. These input parameters 1170 may include a maximum multiband carrier bandwidth (CBWmax), a band granularity parameter (e.g. 20/40/60/80/100/200 MHz), a gap between aggregated bands (SAWgap), and a starting frequency for the SAW banks for that receiver branch (SAWStartFreq).

At step 1104, the unique M-band combinations are listed (e.g. listed in increasing order as rows in a table such as Table 2 above), with total carrier bandwidth being maintained at ≤CBWmax. This total carrier bandwidth is shown in Table 2 as the sums of columns "Bank1-BW1", "Bank2-BW2", and "Bank3-BW3" (for M=3).

At step 1106, each offset value (e.g. "Offset1", "Offset2", and "Offset3" for M=3) is set to a zero value: Offset1=Offset2=Offset3=OffsetM=0.

At step 1108, the value of Fc1 is set equal to: SAWStartFreq+(BW1)/2+Offset1.

At step 1110, the value of Fc2 is set equal to: (Fc1)+(BW1)/2+SAWgap+(BW2)/2+Offset2.

At step 1112, the value of Fc3 is set equal to: (Fc2)+(BW2)/2+SAWgap+(BW3)/2+Offset3.

At step 1114, for embodiments with M>3, the value of FcM is set equal to: $Fc_{M-1}$+$BW_{M-1}$/2+SAWgap+$BW_M$/2+OffsetM.

At step 1116, starting from the first row, adjust Offset1 for each row to align the Fc2 of all same-BW filters in bank2 (i.e., ensure that for each row with the same value for BW2, the sum of BW1+BW2+Offset1 is the same). This will also result in alignment of Fc1 of all same-BW filters in bank1 (because the sum of BW1+Offset1 is now also set to a consistent value in each row). The values in column Offset2 remain all zeroes.

At step 1118, starting from the first row, adjust Offset3 for each row to align the Fc3 of all same-BW filters in bank3 (i.e., ensure that for each row with the same value for BW3, the sum of BW1+BW2+Offset1+BW3+Offset3 is the same).

At step 1120, for embodiments with M>3, repeat step 1118 for each Offset4 to OffsetM as above to align the values of Fc4 to $Fc_M$.

This method 1100 results in separation gaps between the M bands (e.g., in Table 2, "Gap1" between the first and second bands, and "Gap2" between the second and third bands) each having a bandwidth ≥SAWgap.

This embodiment defines the second frequency band as the reference band, i.e. the band having zero offset. However, other embodiments may use a different band as the reference band, with the calculations adjusted accordingly.

In some embodiments, the aggregated bandwidth (column "BW" in Table 2) may be further reduced at step 1122 by manually adjusting the offsets (Offset1, Offset2 etc.) to align the filter center frequencies (Fc1, Fc2, etc.). For example, in Table 2, assuming a SAWgap parameter of 50 MHz, the total aggregated bandwidth for the last row may be reduced from 220 MHz to 160 MHz by decreasing the value of Offset3 to zero, thereby resulting in a Gap2 value of 50 MHz and a Fc3 value (column "Bank3-Fc3") of 2070 MHz. All other values would remain unchanged in that row, and both Gap values ("Gap1" and "Gap2") would still be greater than or equal to the SAWgap parameter value of 50 MHz. However, implementing this feature could require the use of additional SAW filter bank options, thereby presenting a trade-off between potentially smaller bandwidth gaps and hardware complexity and cost.

In use, a system 400 designed by the above method 1100 can be configured and re-configured after deployment in the field to support different multiband combinations by setting the SAW filter bank options for each section 522,523, . . . 524 of the second mixer stage 520. The LOs 562,564, . . . 566 governing the second-stage mixers 525 are configured to down-convert the second-stage input signals to the correct $F_c$ for each section, and the SAW filter banks 542,544, . . . 546 are set to route the input signal through a selected filter option having the correct BW and $F_c$ values, in accordance with the chosen multiband combination (e.g. one of the rows of Table 2). This configuration can be set independently for each branch 500 of the system 400. Once set, the configuration allows the system 400 to receive and aggregate multiband signals according to the chosen multiband combination (or a different combination for each branch 500). The system 400 can be reconfigured at any time to receive and aggregate a different multiband combination (or different multiband combinations for each branch 500). This reconfigurability means that a single such system 400 can be deployed to the field and remain in use through any of a number of changes in the multiband signal combinations being supported.

Figure 8:
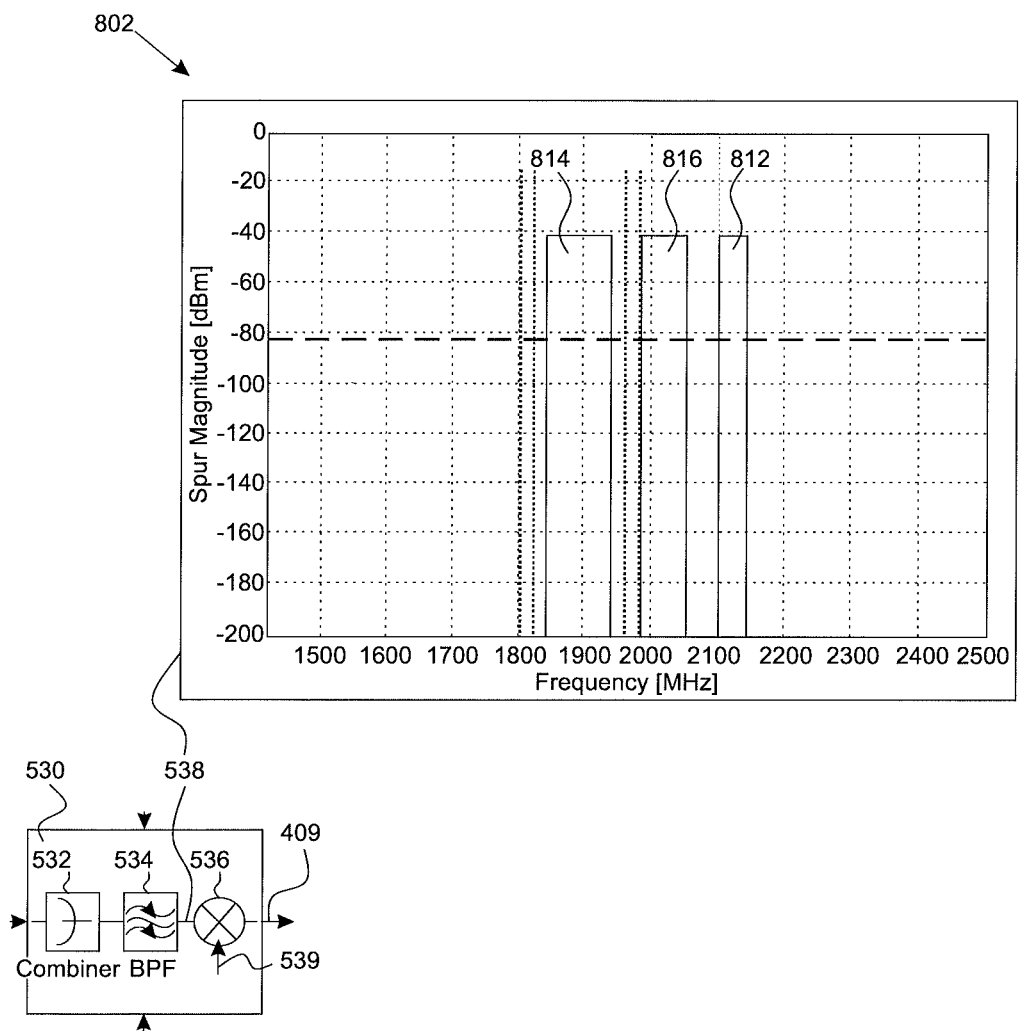
FIG. 8 is a block diagram of an embodiment of a third mixer stage of the receiver branch of FIG. 5, showing a plot of the signal produced by the filter of the third mixer section.

After each section 522,523, . . . 524 of the second mixer stage has applied its SAW filter bank 542,544, . . . 546, the third mixer stage 530 performs another down-conversion, this time to pack together the M bands selected by the M sections 522,523, . . . 524 of the second mixer stage 520. Some embodiments may execute this process without any band separation requirement. With reference to FIG. 5 and FIG. 8, the third mixer stage 530 has a third mixer stage combiner 532 to combine the outputs of the M sections 522,523, . . . 524. The third mixer stage 530 then applies a third mixer stage band pass filter 534 to the combined signal, producing clean combined third mixer stage signal 538 as plotted in plot 802 with the frequency bands 812,814,816 combined and isolated. Third stage mixer 536 then performs a further down-conversion to facilitate combination with the output of the other N−1 receiver branches 408,410, . . . 412 in the receiver system 400. This down-conversion packs the bands 812,814,816 into a frequency range specific to that branch 500, aggregate the output of each branch into a single signal as described in further detail below.

In some embodiments, a unique LO 539 is required for the third mixer stage 530 of each Rx branch 408,410, . . . 412. Each branch 408,410, . . . 412 is configured to pack the output of the third mixer stage 530 into a frequency range unique to that branch, which in some embodiments means that the LO 539 governing the third-stage mixer 536 must be unique for each branch 408,410, . . . 412.

Figure 9:
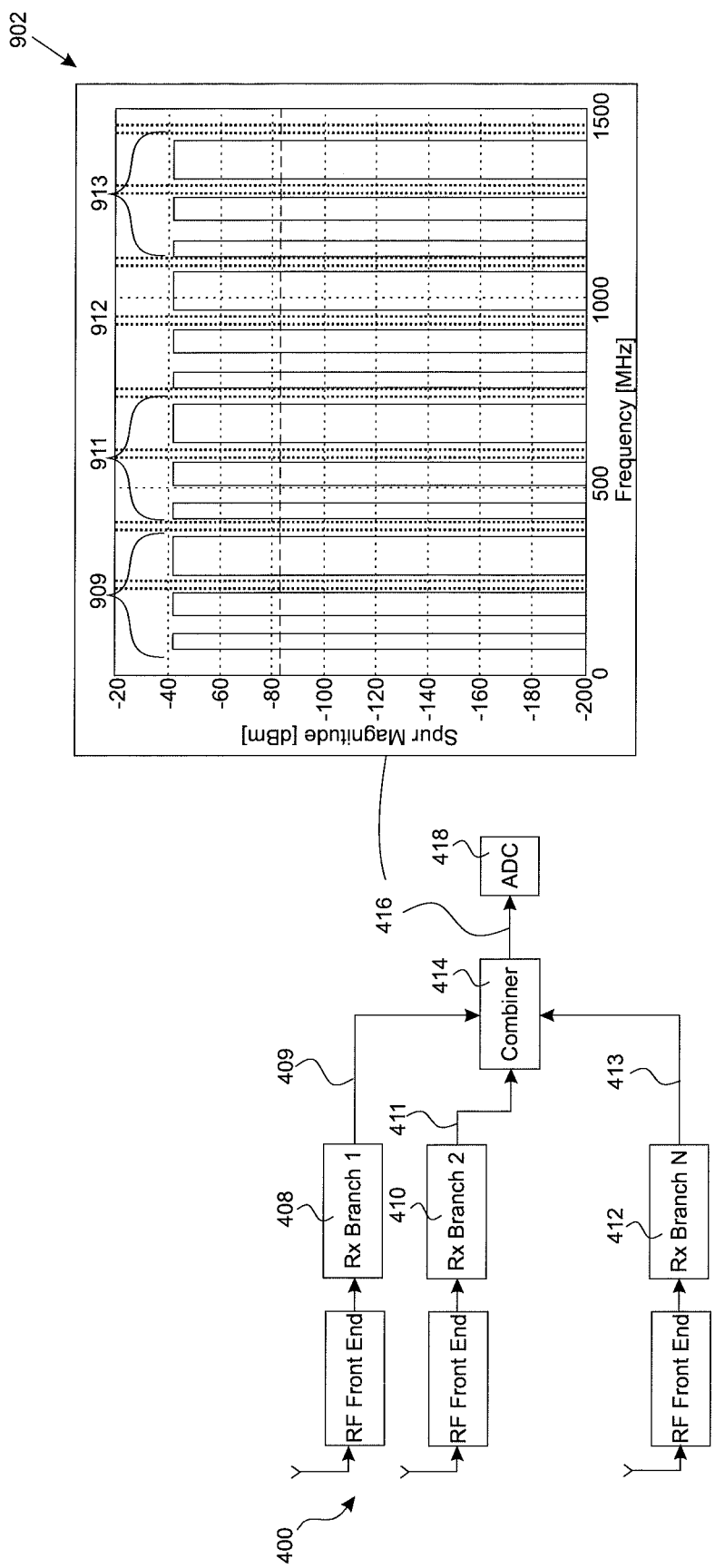
FIG. 9 is the block diagram of FIG. 4, showing a plot of the signal produced by the combiner and passed to the analog-digital converter (ADC)

FIG. 9 illustrates how the output of multiple receiver branches 408,410, . . . 412 is combined by the combiner 414 before being received by a single ADC 418, resulting in aggregation of the output of each branch. Receiver branch output signals 409,411, . . . 413 have each been down-converted by their respective third stage mixers 536 to a unique, non-overlapping aggregated frequency range as plotted in plot 902 of combined signal 416. In this example, four such non-overlapping ranges 909,911,912,913 are shown, corresponding to a receiver system 400 having N=4 branches. Range 909 corresponds to first branch output signal 409; range 911 corresponds to second branch output signal 411; range 912 corresponds to a further branch output signal not shown in FIG. 4 (falling within the ellipsis between the second branch 410 and the Nth branch 412); and range 913 corresponds to Nth branch output signal 413 (where N=4). As discussed above, other embodiments may have N less or greater than N=4 as shown here; in such embodiments, the non-overlapping ranges 909,911,912, . . . 913 are configured with a bandwidth and center frequency to prevent overlap but allow branch output signals 409, 411, . . . 413 to fit within them.

Embodiments of the system 400 may be configured or reconfigured by receiving configuration instructions, such as via a communication link or via user input. In some embodiments, the received configuration instructions correspond to one out of a set of configuration options generated by an algorithm. Thus, in embodiments designed to receive triband signals, the algorithm receives as inputs the center frequency and bandwidth of each of the bands at which the system operates and then generates the optimal configuration for the SAW filter banks and LOs of a given system 400. The output of this algorithm would include settings for a selected option for each SAW bank 542,544,546 as well as settings for each LO 519,562,564,566,539; in multi-branch systems 400, configuration settings would be supplied for each branch 408, 410,412.

In some embodiments, this algorithm would search for the optimal solution for the operating multiband combination: for example, the algorithm may identify and configure an optimal frequency plan to avoid in-band spurs, taking into account the performance of radio-frequency components such as the mixers, filters, ADC and SAW filter banks. The algorithm may do this by first identifying the SAW filter bank options to use based on the operating multiband combination, then sweeping through the allowable frequency range of the first and second mixer stages taking into account the performance constraints of the aforementioned critical radio-frequency components to avoid in-band spurs.

The embodiments described above use up-conversion by the first mixer stage 510. This may enable full flexibility for frequency-agnostic support; however, in some embodiments the up-conversion features of this first mixer stage 510 (such as mixer 512 and LO 519) could be omitted, potentially sacrificing some frequency-planning flexibility.

The embodiments described above have three sections (M=3) in the second mixer stage 520 to support triband functionality; however, as previously discussed, the number of sections (M) can be more or less depending on the number of simultaneously supported bands in a multiband receiver. Bands which are very closely spaced in frequency may in some embodiments be considered as single band to reduce the number of sections M.

The third mixer stage 530 as described above enables the aggregation of multiband signals from multiple second mixer stage sections 522,523, . . . 524; however, some components of this third mixer stage 530 could be omitted in some embodiments if aggregation into the ADC 418 is not required. For example, some embodiments may omit the third stage mixer 536: this could result in the output of each branch 408,410, . . . 412 occupying the same frequency range instead of each branch having its own unique non-overlapping frequency range 909,911,912, . . . 913. Such an embodiment would require each branch 408,410, . . . 412 to use its own ADC 418, because the output of each branch could not be aggregated into a single non-overlapping signal before being processed by a single ADC 418. Such an implementation could be warranted in certain cases, such as cases where the ADC hardware being used cannot accommodate a greater signal bandwidth than the output of a single branch. Some such embodiments could even implement multiband receiver capability as a single wideband branch, eliminating the need for aggregation of multiple branch outputs.

As described above, some embodiments may target applications in the sub-6 GHz frequency range. However, the described architecture may in some embodiments be used for higher frequencies (e.g. cmWave or mmWave). Use at these higher frequencies may depend on the performance of the hardware components used.

The invention disclosure mentions 20/40/60/80/100/200 MHz bands support; however, other bandwidth options can be used.

In some embodiments, this receiver architecture supports any frequency bands and multiband combinations within a designated frequency range (such as sub-6 MHz) using the same hardware by simply changing the frequencies of the local oscillators. This may constitute an advantage over conventional receiver architectures, which are generally dependent on hardware variances to support different frequency bands and multiband variations.

In some embodiments, this receiver architecture supports multiband aggregation from multiple receive chains without restriction on band bandwidth or on frequency gaps between the bands. This may constitute an advantage over the previously described prior art phalanx architecture, which generally optimally aggregate only specific band combinations having specific bandwidths and specific frequency gaps between bands. In addition, this may constitute an advantage over conventional receiver architectures, which do not perform aggregation.

The embodiments described above make reference to radio front-end hardware for receiving signals over a wireless communication link. Other embodiments could use other front-end hardware and/or other types of communications links, such as optical or electrical links and hardware.

The embodiments described above make reference to SAW filters and SAW filter banks. Other embodiments could use other band pass filter technologies, such as film bulk acoustic resonator (FBAR) or bulk acoustic wave (BAW) band pass filters and filter banks.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A system for multi-band communication, the system comprising:
    at least one receiver branch, each receiver branch comprising:
        a band-isolation stage comprising a plurality of sections, each section comprising:
            a band-isolation stage mixer configured to receive a band-isolation stage input signal and down-convert the band-isolation stage input signal to a band-isolation stage frequency value; and
            a filter bank comprising a plurality of band pass filters; and
            a switch configured to:
                select one of the plurality of band pass filters based on a bandwidth associated with a frequency band of interest in the down converted signal, at least one of the bandwidth and the frequency band of interest being identified in received configuration instructions; and
                route the down-converted signal through the selected band pass filter.

2. The system of claim 1, wherein each receiver branch further comprises:
    an up-conversion stage comprising:
        an up-conversion stage mixer for up-converting a received signal to a higher frequency; and
        a splitter for routing the up-converted signal to a plurality of the sections of the band-isolation stage.

3. The system of claim 2, wherein the at least one receiver branch comprises a plurality of receiver branches, and each receiver branch further comprises a band combination stage comprising:
    a band combination stage combiner for combining the output signals of each section of the band-isolation stage of the receiver branch to produce a combined signal; and
    a band combination stage mixer for down-converting the combined signal by
    a band combination stage frequency offset value to produce a band combination stage output signal;
    the system further comprising a branch signal combiner for combining the plurality of band combination stage output signals from the plurality of branches into an aggregated signal.

4. The system of claim 3, further comprising an analog-to-digital converter (ADC) for converting the aggregated signal to a digital signal.

5. The system of claim 3, wherein each up-conversion stage further comprises an up-conversion stage band-pass filter for removing noise spurs from the up-converted signal before the up-converted signal is split by the splitter.

6. The system of claim 3, wherein the up-conversion stage mixer of each of the plurality of receiver branches receives local oscillator input from an up-conversion stage local oscillator (LO).

7. The system of claim 3, wherein each of the plurality of band isolation stage sections further comprises a variable gain amplifier (VGA) for independently adjusting the power of the band isolation stage section output signal before the band isolation stage section output signal is received by the band combination stage.

8. The system of claim 3, wherein the filter banks comprise surface acoustic wave filter banks.

9. The system of claim 3, further comprising a plurality of local oscillators for providing local oscillator inputs to the up-conversion stage mixer, the band-isolation stage mixer, and the band-combination stage mixer,
    wherein the configuration instructions comprise:
        one or more local oscillator frequency settings; and
        filter bank option settings for each filter bank; and
    wherein selecting one of the plurality of band pass filters based on the received configuration instructions comprises selecting one of the plurality of band pass filters based on the filter bank option settings; and
    wherein the system sets the frequency of one or more of the plurality of local oscillators based on the received local oscillators frequency settings.

10. The system of claim 3, wherein the band combination stage further comprises a band-pass filter for removing noise spurs from the combined signal.

11. The system of claim 3, wherein:
    the plurality of receiver branches comprises at least a first receiver branch and a second receiver branch;
    a first section of the band-isolation stage of the first receiver branch receives local oscillator input from a first section local oscillator; and
    a first section of the band-isolation stage of the second receiver branch receives local oscillator input from the first section local oscillator.

12. The system of claim 3, wherein:
    the band-isolation stage comprises at least three sections; and the plurality of band pass filters of each section of the band-isolation stage comprises band pass filters having each of the following bandwidths: 20, 40, 60, 80, and 100 MHz.

13. The system of claim 3, wherein:

the band-isolation stage comprises at least two sections; and the plurality of band pass filters of each section of the band-isolation stage comprises band pass filters having a bandwidth of 100 MHz.

14. The system of claim 3, wherein the plurality of band pass filters of each section of the band-isolation stage comprises at least one band pass filter having a bandwidth of 200 MHz.

15. A method for multi-band communication comprising:

receiving configuration instructions at a plurality of band-isolation stage sections;

receiving a band-isolation stage input signal at the plurality of band-isolation stage sections; and at each band-isolation stage section:
  down-converting the band-isolation stage input signal to a band-isolation stage frequency value;
  selecting one of a plurality of band pass filters based on a bandwidth associated with a frequency band of interest in the down converted signal, at least one of the bandwidth and the frequency band of interest being identified in the received configuration instructions; and
  routing the down-converted signal through the selected band pass filter to propagate a frequency band of the received band-isolation stage input signal.

* * * * *